United States Patent
Pigeon

[11] Patent Number: 6,160,918
[45] Date of Patent: *Dec. 12, 2000

[54] METHOD AND APPARATUS FOR FAST IMAGE COMPRESSION

[75] Inventor: Steven P. Pigeon, Holmdel, N.J.

[73] Assignee: AT&T Corp., New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/942,684

[22] Filed: Oct. 2, 1997

[51] Int. Cl.$^7$ .................................................. G06K 9/36
[52] U.S. Cl. ......................... 382/248; 382/251; 382/166; 708/400
[58] Field of Search .......................... 382/250, 251, 382/256, 248, 166, 232, 246; 348/395, 403–408; 358/426–427; 341/65, 67

[56] References Cited

U.S. PATENT DOCUMENTS

| | | | |
|---|---|---|---|
| 4,947,447 | 8/1990 | Miyaoka et al. | 382/246 |
| 5,339,265 | 8/1994 | Liu et al. | 708/400 |
| 5,341,442 | 8/1994 | Barrett | 382/166 |
| 5,430,556 | 7/1995 | Ito | 358/427 |
| 5,491,761 | 2/1996 | Kim | 382/251 |
| 5,615,020 | 3/1997 | Keith | 358/426 |
| 5,696,507 | 12/1997 | Nam | 341/67 |
| 5,754,457 | 5/1998 | Eiton | 708/402 |
| 5,850,484 | 12/1998 | Beretta et al. | 382/250 |

OTHER PUBLICATIONS

Bracewell, Affine theorem for the Hartley Transform of an Image, IEEE vol. 82, No. 3, pp. 388–390, 1994.
Xingming et al., The Fast Hartley Transform on the Hypercube, ACM 0–89791–273–X/88/0007 pp. 1451–1454, 1988.
Arai et al., A Fast DCT–SQ Scheme for Images, IEICE vol. E 71 No. 11, pp. 1095–1097, 1988.
Poularikas, The Transform and Applications, Handbook, IEEE Press, pp. 281–285, 1995.
"A More Symmetrical Fourier Analysis Applied to Transmission Problems", R. V. L. Hartley, Proceedings of the I.R.E., Mar. 1942, pp. 144–150.
"Discrete Hartley Transform", R. N. Bracewell, J. Opt. Soc. Am., vol. 73, No. 12, Dec. 1983, pp. 1832–1835.
"The Fast Hartley Transform", Ronald N. Bracewell, Proceedings of the IEEE, vol. 72, No. 8, Aug. 1984, pp. 1010–1018.
"Fast Two–Dimensional Hartley Transform", R. N. Bracewell, et al., Proceedings of the IEEE, vol. 74, No. 9, Sep. 1986, pp. 1282–1283.
"Structured Fast Hartley Transform Algorithms", C. P. Kwong and K. P. Shiu, IEEE Transactions on Acoustics, Speech, and Signal Processing, vol. ASSP–34, No. 4 Aug. 1986, pp. 1000–1002.
"Improved Fourier and Hartley Transform Algorithms: Application to Cyclic Convolution of Real Data", Pierre Duhamel and Martin Vetterli, IEEE Transaction on Acoustics, Speech, and Signal Processing, vol. ASSP–35, No. 6, Jun. 1987, pp. 818–824.

*Primary Examiner*—Leo H. Boudreau
*Assistant Examiner*—Ishrat Sherali

[57] ABSTRACT

An image compression scheme uses a reversible transform, such as the Discrete Hartley Transform, to efficiently compress and expand image data for storage and retrieval of images in a digital format. The image data is divided into one or more image sets, each image set representing a rectangular array of pixel data from the image. Each image set is transformed using a reversible transform, such as the Hartley transform, into a set of coefficients which are then quantized and encoded using an entropy coder. The resultant coded data sets for each of the compressed image sets are then stored for subsequent expansion. Expansion of the stored data back into the image is essentially the reverse of the compression scheme.

63 Claims, 5 Drawing Sheets

THE $H_8$ KERNEL, i.e., $H_N$ FOR N=8

$$\begin{bmatrix} 1 & 1 & 1 & 1 & 1 & 1 & 1 & 1 \\ 1 & \sqrt{2} & 1 & 0 & -1 & -\sqrt{2} & -1 & 0 \\ 1 & 1 & -1 & -1 & 1 & 1 & -1 & -1 \\ 1 & 0 & -1 & \sqrt{2} & -1 & 0 & 1 & -\sqrt{2} \\ 1 & -1 & 1 & -1 & 1 & -1 & 1 & -1 \\ 1 & -\sqrt{2} & 1 & 0 & -1 & \sqrt{2} & -1 & 0 \\ 1 & -1 & -1 & 1 & 1 & -1 & -1 & 1 \\ 1 & 0 & -1 & -\sqrt{2} & -1 & 0 & 1 & \sqrt{2} \end{bmatrix}$$

THE FAST HARTLEY TRANSFORM DATA FLOW FOR $H_8$

PRECISION CONTROL DURING THE TWO STAGES OF THE FHT

| CODES | VALUES |
|---|---|
| 00+1 BIT | −1,+1 |
| 01+3 BITS | −5,−4,−3,−2,+2,+3,+4,+5 |
| 10+4 BITS | ZERO RUN OF LENGTH 1,...,16 |
| 110+6 BITS | ZERO RUN OF LENGTH 17,...,64 |
| 1110+5 BITS | −21,...,−6,+6,...,+21 |
| 11110+7 BITS | −85,...,−22,+22,...,+85 |
| 111110+8 BITS | −213,...,−86,+86,...,+213 |
| 1111110+12 BITS | −2261,...,−214,+214,...,+2261 |
| 1111111+15 BITS | AND MORE |

(a) NON-CANONICAL HUFFMAN CODING TREE (b) CANONICAL HUFFMAN CODING TREE (c) CODE (LEAF) FUSION

METHOD AND APPARATUS FOR FAST IMAGE COMPRESSION

TECHNICAL FIELD

This invention relates to storage of image or video data in general and, more particularly, provides an efficient and fast way of compressing and expanding image or image data for storage and retrieval.

BACKGROUND OF THE INVENTION

Image compression techniques based upon transforms such as the Discrete Cosine Transform (DCT) and the Real Fourier Transform (RFT) are well known. The Hartley Transform is a time domain to frequency domain transform in the same class of transforms as the Discrete Cosine Transform and the Real Fourier Transform, and it uses an orthonormal basis function as its kernel. The prototype transform was introduced by Hartley in the early 1940's but received its current name and form recently (see Bracewell, Ronald N., "The Fast Hartley Transform," Proceedings of the IEEE, vol.72, no. 8, August, 1984, pp. 1010–1018).

A. The Continuous Hartley Transform

The Hartley Transform $H_f(X)$ of a time function $X(t)$ in relation to a frequency f is $$F(f) = H_f(X) = \int_{T_d} X(t) \text{cas}(2\pi ft) \partial t$$

where $T_d$ is the time domain (the set of valid time values), and where the function Cas($2\pi$ft) is used as the orthonormal basis function. Cas(x) is to be remembered as cosine and sine (an abbreviation that Hartley used.), defined as $$\text{cas}(x) = \cos(x) + \sin(x) = \sqrt{2} \sin(\pi/4 + x)$$

Likewise, the inverse Hartley Transform $H_t^{-1}(F)$ of the frequency function $F(f)$ at time t is given by $$X(t) = H_t^{-1}(F) = \int_{F_d} F(f) \text{cas}(2\pi ft) \partial f$$

where $F_d$ is the frequency domain (the set of valid frequencies).

The Hartley Transform generalizes to an arbitrary number of dimensions quite easily. For two dimensions, the Hartley transform is given by $$F_2(f_1, f_2) = H_{f_1, f_2}(X) = \int_{T_1} \int_{T_2} X(t_1, t_2) \text{cas}(2\pi (f_1 t_1 + f_2 t_2)) \partial t_1 \partial t_2$$

The Hartley Transform generalizes to any number of dimensions, but this integral is not separable, that is, the kernel cannot be separated into a product of two functions, one that depends only on $f_1 t_1$ and another only on $f_2 t_2$. The separability of the transform is of great importance for ease of implementation and optimization. To achieve separability using the cas($2\pi$ft) function as a basis, the nice physical interpretation of a directed wave over the plane, with $t_1$ and $t_2$ as direction vectors, must be abandoned and replaced with the less intuitive one of products of waves that are perpendicular to the axes. The separable variant of the Hartley Transform in two dimension is therefore $$F_2(f_1, f_2) = H_{f_1, f_2}(X)$$

$$= \int_{T_1} \int_{T_2} X(t_1, t_2) \text{cas}(2\pi f_1 t_1) \text{cas}(2\pi f_2 t_2) \partial t_1 \partial t_2$$

B. The Discrete Hartley Transform

As for most transforms, a discrete version of the Hartley Transform exists, as discussed by Bracewell in several papers (see, e.g., Bracewell, Ronald N., "The Fast Hartley Transform," Proceedings of the IEEE, vol.72, no. 8, August, 1984, pp. 1010–1018, and Bracewell, R. N., O. Buneman, H. Hao and J. Villasenor, "Fast Two-Dimensional Hartley transform,", Proceedings of the IEEE, vol.74, no. 9, September, 1986, pp. 1282–83). The discrete version is specially well suited for computer implementation. The Discrete Hartley Transform (DHT) $H_{N,f}(X)$ of the vector X in relation to a frequency f defined on N points is given by $$F(f) = \tilde{H}_{N,f}(X) = \frac{1}{N} \sum_{t=0}^{N-1} X_t \text{cas}\left(\frac{2\pi}{N} ft\right) \quad (1)$$

where $f \in \{0, \ldots, N-1\}$. The inverse DHT $H_{N,t}^{-1}(F)$ of the vector F at time t defined on N points is given by $$\tilde{H}_{N,t}^{-1}(F) = \sum_{f=0}^{N-1} F_f \text{cas}\left(\frac{2\pi}{N} ft\right) = X_t \quad (2)$$

where $t \in \{0, \ldots, N-1\}$. Assuming, for simplicity and without loss of generality, that the numbers of points in all dimensions are equal, the two-dimensional (2-D) DHT is then $$\tilde{H}_{N,N,f_1,f_2}(X) = \frac{1}{N^2} \sum_{t_1=0}^{N-1} \sum_{t_2=0}^{N-1} X(t_1, t_2) \text{cas}\left(\frac{2\pi}{N} f_1 t_1\right) \text{cas}\left(\frac{2\pi}{N} f_2 t_2\right)$$

which is separable. In other words, the 2-D DHT can be computed using only the one-dimensional (1-D) transform $H_{N,f}(X_{*,t})$ computed on the rows of the 2-D matrix X, and then computed on its columns.

The Hartley Transform has been used in various contexts. Although the Hartley Transform has been considered for image compression, there has been little, if any, development of compression algorithms using the Hartley Transform. In some papers, the Discrete Hartley Transform was included in a list of candidates and was compared to the DCT—only to be rapidly dismissed as being roughly equivalent. Bracewell wrote several papers and a book on the Hartley Transform, but he did not consider it for compression. In *Digital Image Processing* by William Pratt (John Wiley & Sons, 2nd Ed. 1991), the Hartley Transform is only presented as part of a rather excellent and exhaustive list of transforms. In papers by Bracewell, techniques for Fast Hartley Transforms are presented, but all consider rather general cases. The previous papers did not explore the use of the actual numerical values of the transform matrix for a given size and how these values could be exploited to get a much more efficient algorithm useful for image compression.

What is desired is a practical way of utilizing the advantages of a transform such as the Discrete Hartley Transform in order to efficiently compress and expand digital images.

SUMMARY OF THE INVENTION

The present invention is directed to use of a reversible transform, such as the Discrete Hartley Transform, to efficiently compress and expand image data for storage and retrieval of images in a digital format. The image compression scheme of the present invention divides the image data into one or more image sets, each image set representing a rectangular array of pixel data from the image. Each image set is transformed using a reversible transform, such as the Hartley transform, into a set of coefficients which are then quantized and encoded using an entropy coder. The resultant coded. data sets for each of the compressed image sets are then stored for subsequent expansion. Expansion of the stored data back into the image is essentially the reverse of the compression scheme.

DETAILED DESCRIPTION

Figures 1, 2:
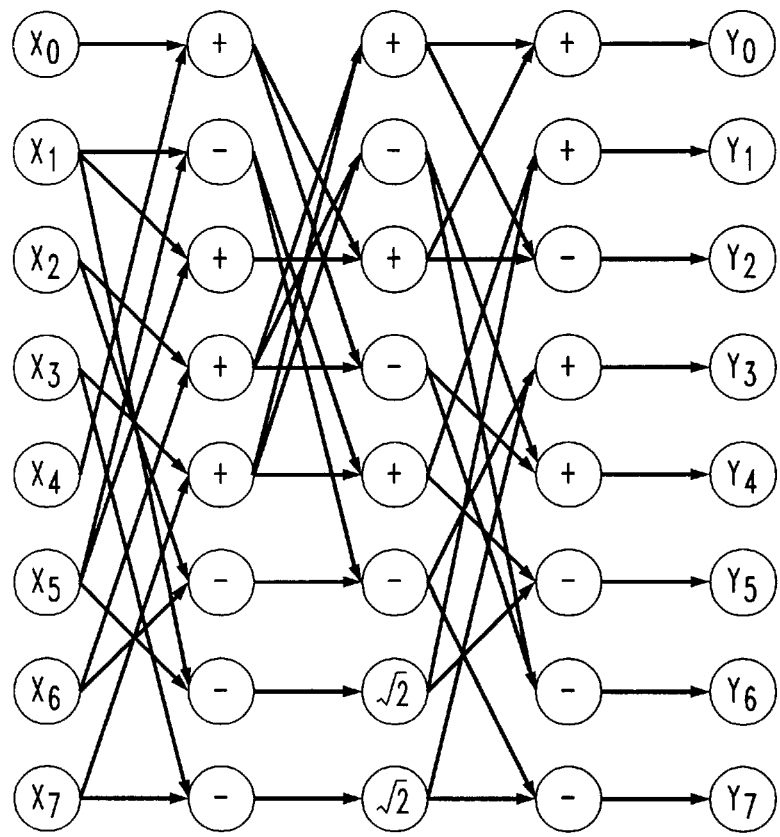
FIG. 1 shows the Discrete Hartley Transform kernel for N=8.
FIG. 2 shows the Fast Hartley Transform data flow for N=8.

One of the advantages of the Discrete Hartley Transform is that its transform matrix is especially well behaved. For example, in the special case where the kernel size is chosen for N=8, some very important optimizations can be made so that computation time and hardware are reduced significantly. In accordance with the present invention, an algorithm based upon the 2-D DHT with a kernel size of N=8 is utilized as part of a fast image compression and expansion system. Other values of N (representing other kernel sizes for the DHT) may also be utilized in connection with the teachings of the present invention.

A. Properties of the Matrix $H_N$ and Image Compression

In selecting a fast transform, we are interested in many properties. If one considers the use of a transform for data compression and expansion, one of those properties is reversibility, i.e., where the inverse transformation used for expansion is (within a constant) the same as the forward transformation used for compression. Another is simplicity. Furthermore, if the transform can be made symmetrical, namely where the forward and inverse transform are the same, there is an advantage in implementation: one hardware device, or algorithm, can be used to compute both the forward transform and its inverse. Yet another property which is interesting for the construction of the fast transform, is the actual number of different values you find in the transform matrix.

From equations (1) and (2) above, it can be shown that the discrete transform pair can be expressed symmetrically. The forward transform can be expressed as $kH_N X^T = F$, where the unitary transform matrix $H_N$ is such that $h_{ft} = cas(2\pi ft/N)$, for $t, f \in \{0, \ldots, N-1\}$, the constant $k = 1/N$, and $X^T$ is the transpose of vector X. The inverse transform is expressed by $H_N F^T = X$. Therefore, $H_N(kH_N X^T)^T = X$, which proves that the DHT is a reversible transform. By this, we also conclude that $H_N^{-1} = kH_N$, which is most convenient, since the inverse transform may be computed by simply computing $H_N F = X$, or the forward transform by computing $kH_N X = F$.

This symmetry feature can be exploited in software as well as in hardware; that is, a single device or single algorithm may be used to compute both the forward transform and its inverse.

Not only does the matrix HN has the property of being its own inverse (putting aside for the moment the constant k), it also turns out that for chosen values of N, the matrix $H_N$ contains very few distinct values. For example, for the case where N=8, only the two different values arise (not counting signs). In comparison, the DCT, for example, has six different values (without counting signs) for the case wherein N=8. In other cases of the DHT, for instance N=16, we get 5 different values (again without counting signs), or with N=32, we get only 8. The number of different values for the DHT grows slowly with N.

In relation to image compression, the choice of the size of the DHT kernel, for example an 8 point DHT or a 16 point DHT, should be made while considering several interrelated observations. First, the number of points N for a DHT is not restricted by image size, as sets of the image (i.e., image patches) each containing a 2-D portion of image data elements (image data elements are also known as picture elements, or "pixels") may be selected, where the size of the set or patch matches the size of the DHT in each dimension. Second, the smaller the image set, the faster the DHT may be computed for the given patch. As the patch grows larger, for instance 16×16 or 32×32, the transform becomes more sensitive to quantization of the lower frequency coefficients, which may result in distortions having the (annoying) visual effect of block discontinuities when the sets are reassembled back into the image. Third, if the kerrel size is set smaller, say 4×4, it may not decorrellate the data efficiently and none of the coefficients may be zeros.

Thus, a "compromise" choice, one providing reasonably good results as to computational efficiency as well as qualities of the reconstructed image, is for a patch size of 8×8 pixels. At a size of 8×8 pixels, greater quantization can be applied before one can notice the blocking effect and, on average, many coefficients are zero, or are at least very small.

Thus, for the 8×8 patch size, i.e. $H_8$, an algorithm is obtained in accordance with the present invention that computes the Hartley Transform efficiently. The DHT kernel for N=8 is shown in FIG. 1. Indeed, the symmetrical nature of the DHT and the low number of distinct values in the $H_N$ (and not only $H_8$) kernel allow computation using a 1-D Fast Hartley Transform, that is, a transform that is computed with an algorithm on the order of O(N log N), which is much more efficient than the $O(N^2)$ required by a non-separable 2-D algorithm.

For the case where N=8, (i.e. $H_8$) the kernel values $h_{ft}$ are either ±1, 0, or ±√2 (as shown in FIG. 1) The zero terms can be trivially removed from the computation. Whenever $h_{ft}$=±1, there are no multiplication required, only integer additions or subtractions. The ±√2 terms are just a little bit more computationally involved, but the two multiplications needed may be approximated in hardware by a series of bit shifts and additions. Given the precision (in terms of number of precise bits required) of the values in the vector X, very few terms are needed to compute a satisfying approximation of ±a√2, for some integer a. Indeed, experiments show that replacing ±√2 by ±1.5 provides satisfactory results some cases.

For the case where N=8, a "butterfly" computation for the DHT is shown in FIG. 2. Similar to the Fast Fourier Transform, this is denoted as the Fast Hartley Transform (FHT), a special case of the more general term Hartley transform. For other values of N, the FHT algorithm can be optimizized where N, the number of points in the DHT kernel, is a power of 2. In the case where N is a power of 2, the final divisions needed by the constant k=1/N are reduced to fixed bit shifts that can be computed gratis in hardware (since they don't even require a barrel shifter) and with minimal time in software.

For the two dimensional case, a non-separable 2-D matrix $H_{N,N}$ (having four dimensions) would need to multiply a matrix X (having two dimensions) resulting in a matrix F (also having two dimensions). However, since we are using a separable version of the transform, we do not need the matrix $H_{N,N}$, but only $H_N$. In general, the algorithm using the separable matrix requires computations on the order of $O(mN^m \log N)$, where m is the number of dimensions (and assuming only N points in each dimension). Thus for a separable 2-D FHT, the number of computations are on the order of $O(N^2 \log N)$ instead of $O(N^3)$ for the straight forward transform (using plair matrix multiplication).

As seen from FIGS. 1 and 2, for the Fast DHT with N=8, only two multiplications and 22 additions are needed to compute an 8-point FHT. Comparatively, with the Fast DCT (FDCT), for instance, 29 additions and 11 multiplications are required. However, as has been pointed out by others, many of the multiplications needed for the FDCT use multiples of a same coefficient. Thus, to improve speed, in some applications those multiplications have been moved out of the FDCT and incorporated into the subsequent quantization scheme. Therefore, to assure exact results with the FDCT algorithm, one has to go through the quantization. This reduces the number of multiplication to 5 in the (not quite) FDCT while not really adding anything to the quantization step.

A similar reduction may be employed with respect to the FHT, reducing the computations of the FHT for N=8 with no multiplications at all, only additions. Although this technique may not always provide optimal results, however, it provides a good mechanism for speeding up computation of the algorithm.

B. Image Compression Using the FHT

Techniques for using the FHT will now be describDed in connection with the image compression system of the present invention. We describe here the proposed method and its various sub-processes.

Similar to other transform-based compression schemes, the compression scheme of the present invention includes quantization and, where appropriate, decimation as a way to reduce the actual quantity of information to be stored, while making sure that no perceptually important information is destroyed. The data compression is obtained by the quantity of bits thrown away in the quantization and decimation process. However, the amount of actual compression to obtain is constrained by the desired quality of the image.

In accordance with an embodiment of the present invention, the actual numerical values of the transform matrix for a given size, (e.g., where N=8 as discussed above) can be exploited, such that, as part of the image compression process, the FHT may be computed using all additions and subtractions (no multiplications), or using only additions, subtractions and bit shifting.

Further aspects of the present invention will now be discussed.

1. Precision Control

The interesting properties of the FHT are not only related to the complexity of the algorithm but also to the actual numerical output. First, half of the coefficients output for a 8-point FHT are exact integer values, since they are computed only with integer operations. The other four can be made to retain a reasonable precision by using a sufficiently precise approximation of the quantity ±a√2. Thus, use of the FHT transform may be combined, in accordance with the present invention, with "quantization" of the coefficients output by the transform between stages of the transform. That is, some bits can be thrown away in order to either boost compression or minimize the amount of hardware needed. This is accomplished by controlling the precision of the transform algorithm as described below.

Figure 3:
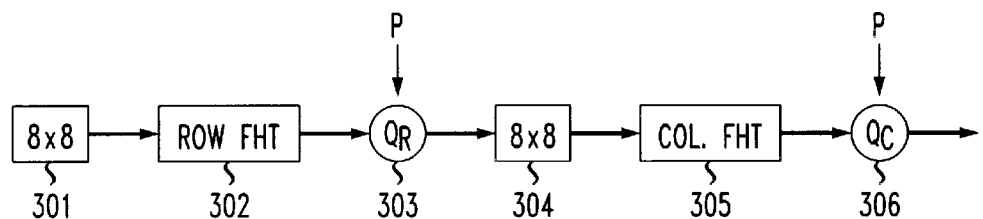
FIG. 3 shows precision control during the FHT as used in accordance with the present invention.

The optional precision control of the FHT algorithm in accordance with the present invention is shown in FIG. 3. The precision controller governs how many bits are manipulated by the FHT transformer. In a software implementation, the precision parameter control results only in more accurate computations when the "quantization" is low, and in low precision when the "quantization" is high. There is no computational gain, in terms of speed, since in software integers have a fixed numbers of bits. In a hardware implementation, however, high "quantization" results not only in lower precision but also permits less complex designs for an FHT transformer.

In the experiments, precision was controlled by retaining only a certain number of bits, the number of which was modified by experiment, after the decimal point (that is, experiments performed used precision control such that either six bits were kept after the decimal point, three bits were kept after the decimal point, or none were kept). There was no rounding error control; the numbers were simply truncated.

Referring to FIG. 3, the precision controller according to the present invention will now be explained with reference to an 8×8 FHT. A set of image data 301, containing an 8×8 array of pixels, is processed by a 1-D FHT 302 which operates on the rows of the image patch ("row FHT"). The output of the row FHT (an 8×8 array of data) is then "quantized" by quantizer $Q_R$ 303, which reduces the number of bits contained in the output from the operation of the row FHT 301 upon the image patch 301. The output 304 of quantizer $Q_R$ 303, which is itself an 8×8 array of data, is then processed by a 1-D FHT 305 which operates on the columns of the 8×8 array of data ("column FHT"). The output of the column FHT is then "quantized" by quantizer $Q_C$ 306, which reduces the number of bits contained in the output from the operation of the column FHT 305 upon the data patch 304.

Those skilled in the art will recognize that the precision control option described above is applicable to an FHT sized for N other than N=8, and that the precision control may be accomplished in a variety of similar ways without detracting from the benefits of the present invention, by, e.g., rounding rather than truncation.

2. Learning the Output Coefficient Quantization

Once the FHT step is performed (including the optional precision control), the coefficients that result from the FHT process are quantized as a set in, order to increase the degree of compression. The strategy in quantizing the coefficients is to throw away the coefficients that are the least important while quantizing the coefficients that are kept. Suppose that it is known which coefficients are the most important, or that we have at least some ideas on their ordering; a function f(i,j) that sorts out the coefficients in such a way that the most important come first, and the least important comes last is desired. One way to do this is by guesswork, using the known transform's properties and assume some distribution of frequencies in the images that are to be compressed in accordance with the teachings of the present invention.

Alternatively, the coefficient sorting function f(i,j) can be learned by statistically determining, over a large and diversified test set, which of the coefficients contain more energy, and then sort the coefficients accordingly. The function f(i,j) or the rank of the coefficients has been learned experimentally using a sample of nearly 1,000,000 patches coming from 215 images. To learn the coefficient ranking, the mean absolute energy of the coefficients, $E[|F_{ij}|]$, was computed for each i,j ∈ {0, . . . , 7} (where F is a transformed matrix), and then the coefficients were sorted in decreasing order of magnitude. The function f(i,j) establishes a partial order so that $F'_{f(i,j)} = F_{ij}$ and such that, in general, $E[|F'_0|] \geq E[|F'_1|] \geq \ldots \geq E[|F'_{m-2}|] \geq E[|F'_{m-1}|]$ where $m = N^2$. Once we have this ordering function, quantization may be applied. The quantization function used in connection with experimentation for the present invention is of the form $$Q_c(x_{ij}) = \left[\frac{x_{ij}}{[g(c, f(i, j))]}\right]p$$

where g(c, f(i,j)) is some monotonically growing function in f(i,j), with a parameter c≧1, the "quality" factor. The function g(c, f(i,j)) is required to he a monotonically growing with a sufficiently gentle slope in order to minimize or correct any misordering of the function f(i,j). In accordance with experimentation, the function $g(c, f(i,j)) = c1.025^{f(i,j)}$ was found satisfactory. The effect of applying this quantization function is to throw bits away as a means of (lossy) compression.

3. Monochrome Image Compression

Figure 4:
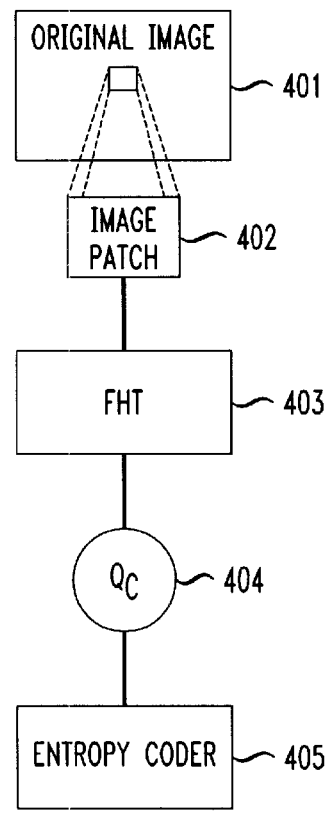
FIG. 4 contains a block diagram showing image data compression in accordance with the present invention.

With reference to FIG. 4, the image compression scheme of the present invention will now be described. It is assumed in the following description that the image is representative of a monochromatic image (i.e., each data point of the image consists of a single value representing the grey scale visual information); application of the compression scheme of the present invention upon color imagery will be described in the section following the monochromatic section. For purposes of illustration, it will be assumed that an 8-point FHT (i.e., N=8) is used for the Hartley (or, even more generally, the reversible) transform. Those skilled in the art will recognize that the compression scheme of the present invention is also applicable to FHT sizes other than where N=8.

From the original 2-D monochrome image 401 are extracted one or more image sets, each such image set consisting of an array of pixels having dimensions equal to the size(s) of the FHT transform to be used. Because it is assumed, for purposes of illustration, that an 8-point FHT is used, each image set is an 8×8 array. It should be pointed out that, since the FHT can be of any size, where the size of the FHT transform(s) used is/are equal to the dimensions of the image itself, only a single image set—i.e., the image itself—is required to be processed. Thus, e.g., if the image is an array of 512×512 pixels, a 512-point FHT may be used to compress the image. The number of image sets is determined from the ratio of the image size to the size of the image patch used. Thus, e.g., if the image is an array of 512×512 pixels and the image patch or set is 8×8 (i.e., for use with an 8-point FHT), the number of image sets extracted and processed will be 64*64, or 4,096 sets. Each image set (including the case where a single image set includes the entire image) is processed in accordance with the steps described below with respect to a selected image set 402.

Image set 402 is processed by 8-point FHT transformer 403, where the FHT transformer includes the 35 same functionality as described above in connection with FIG. 3. Thus, the FHT is computed by using two passes of a 1-D FHT—that is, a row FHT and a column FHT—where the row FHT and column FHT may be applied in any order. The optional precision controller may be used to control precision of the FHT. Following the FHT transformer, the output coefficients are quantized by quantizer 404 using the learned quantization described above or another quantization scheme that may be suited to the type of image data being compressed. The quantized coefficients are then output to an entropy coder 405 which encodes each of the coefficients (i.e., replaces each coefficient value with a code preassigned to that value), thus producing a coded bitstream of data that can be stored in a digital memory.

While the image compression scheme of the present invention is designed to work with a variety of entropy coding techniques, an optimal coder would be one that matches the probability distribution of the coefficient values output by the FHT. In accordance with the present invention, a coder was obtained using a canonical Huffman coding tree by making an ad hoc representation of the integers around 0 using the bounds and the probability distribution of the coefficients output by the FHT. Strings of zeros were handled as special cases. A coding table for this example is presented in FIG. 5A and was used successfully in experimentation.

In accordance with the present invention, a more generalized coding scheme will now be described, with reference to FIGS. 5B and SC, which operates on a set of unimodal coefficients centered about zero that result from the FHT operation (this allows for a symmetric code, such as shown in the coding table of FIG. 5A). As shown in step 501 of FIG. 5B, a complete canonical Huffman coding tree is computed for an expected distribution of coefficient values from the transform, such that all frequent codes are on the same side of the tree (techniques for computing a canonical Huffman coding tree are well known to those skilled in the art). In contrast with a non-canonical Huffman coding tree (illustrated in sketch (a) of FIG. 5C), a canonical Huffman coding tree, as illustrated in sketch (b) of FIG. 5C, is one where all codes having the same length are in ascending order. Thus, the codes for symbols A–F (i.e., the "values" being coded) are, for the non-canonical and canonical Huffman coding trees illustrated in FIG. 5C(a) and (b) are given as follows:

| symbol | code: non-canonical tree (a) | code: canonical tree (b) |
|--------|------------------------------|--------------------------|
| A      | 10                           | 00                       |
| B      | 01                           | 01                       |
| C      | 111                          | 100                      |
| D      | 110                          | 101                      |
| E      | 001                          | 110                      |
| F      | 000                          | 111                      |

Figures 5A, 5B:
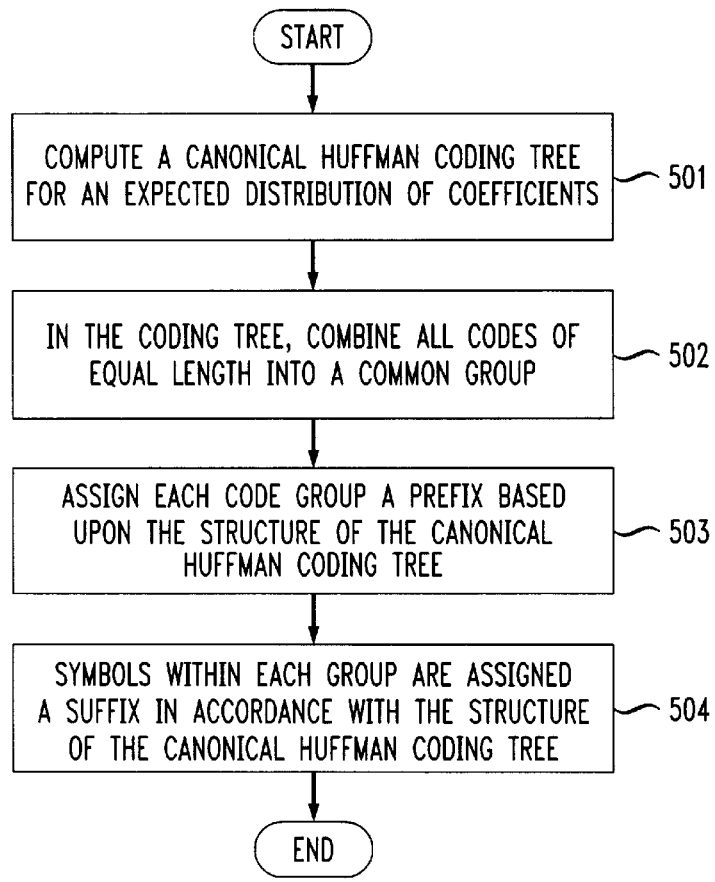
FIG. 5A shows a representative entropy code used in accordance with the present invention.
FIG. 5B shows a method for computing an entropy code for use in connection with the present invention.
Figure 5C:
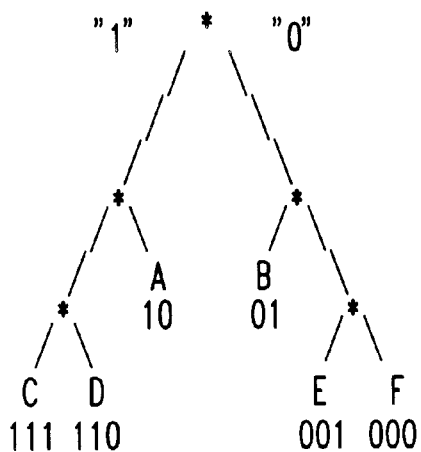
FIG. 5C illustrates a characteristic of a canonic Huffman coding tree.
Figure 5C:
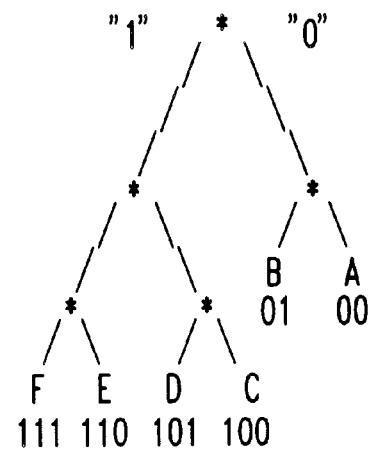
Figure 5C:
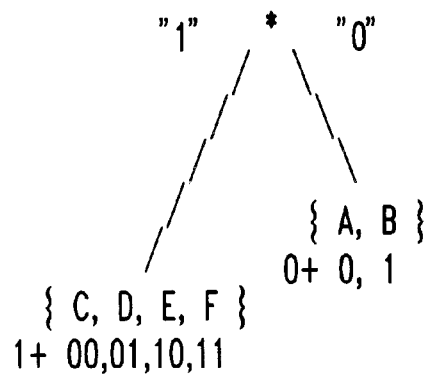

Similarly, the values in the coding table of FIG. 5A are shown in ascending order.

Next, at step 502 in FIG. 5B all codes of equal length are combined, or fused, into a common group. This process, also known as "leaf fusion," is illustrated in sketch (c) of FIG. 5C for the canonical Huffman coding tree of FIG. 5C(b). The codes for symbols A and B (each of length 2 bits) are combined into one group, and the codes for symbols C–F (each of length 3 bits) are combined into a second group. It should be noted that in the illustration of FIGS. 5C(b) and (c), these two sets are uniquely identified by the first bit. That is, if the first bit is a '0', we know that the symbol will be either an A or a B from the first group; however, if the first bit is a '1', then we know that the symbol will be one of the second group, C–F. This part of the code that uniquely identifies groups of symbols or values is known as the prefix.

As each group of symbols or values may be identified by the prefix part of the code, then, each code group is assigned a prefix based upon the structure of the canonical Huffman coding tree at step 503 in FIG. 5B.

Within each group, the values or symbols being coded are uniquely identified by the suffix, or the bits remaining after the prefix. In the groups illustrated in FIG. 5C(b), the first group {A,B}, having a prefix of '0', is identified by the second (suffix) bit: if the suffix bit is '0', then the symbol is A, and if the suffix bit is '1', then the symbol is B. Similarly, for the second group, the 4 symbols C–F are identified as a group by the prefix bit ('1') and within the group by the second two (suffix) bits (e.g., where the suffix bits are '11', the symbol is F. Thus, at step 504 in FIG. 5B, within each group the symbols are assigned a suffix in accordance with the structure of the canonical Huffman coding tree.

Thus, examining the code shown in FIG. 5A, it may be seen that the code has a prefix (the first part—i.e. the "ones" and "zeros"—shown) and a suffix (a numeric value for the number of bits, shown after the "ones" and "zeros," used to represent the portion of the code after the prefix). The prefix is used to identify a range or group of values having a common code length, and the suffix is used to identify the individual values within that range or group of values.

Using the canonical Huffman coding tree process of the present invention, the decoding process is as follows. First, the beginning part of the code is matched against the known prefixes to identify the group. Once the group is identified, the suffix is matched against the known suffixes for that group to identify the particular symbol or value within that group.

Use of the entropy coder of the present invention, as illustrated in FIGS. 5A–5C, presents advantages over other entropy coding techniques, such as the Huffman or Solomon-Golomb coding schemes. For example, the entropy coder of the present invention is better at handling a broader range of the distribution of frequency coefficients, as may be typically found in transformed image data, because the decision tree for the coder is less complex than the decision trees for Huffman or Solomon-Golomb coders.

The process of encoding and decoding of the present invention is also faster than the others because the depth of the decision tree is shorter. Those skilled in the art will recognize that the benefits of the entropy coder of the present invention may be enjoyed where transforms other than the DHT (e.g., DCT) are used.

Returning now to the image compression scheme, the compression technique described above for an image set is repeated for the remaining image sets until all of the image data has been processed. Whether the image sets are extracted and processed in horizontal or vertical order is immaterial, as long as the same order is used for reconstructing the image by means of decompression. There does not need to be any overlap of image data between successive image patches. For each of the compressed image sets, the resultant coded bitstream is stored for subsequent expansion.

Restoring the compressed image (i.e., expansion of the stored data back into the image data) is a process of "decompression" that is exactly the inverse of the compression process. Thus, starting with the entropy-coded bitstream, the bitstream is decoded into coefficients, the coefficients are unquantized, then Hartley inverse-transformed and finally reassembled patch-by-patch into the final image. "Unquantization" is the opposite of quantization—the addition of bits or digits to expand the range of potential values for the coefficients. To illustrate, a quantizer operating on the value X typically retains the integer portion of $[X/z]$, where z is the quantization coefficient:

$$Y=\text{INTEGER}[X/z]$$

An unquantizer reverses the process by multiplying the quantized value by the quantization coefficient z:

$$X=Y*z$$

Thus, e.g., if to begin X=2141 and the quantization coefficient z=10, the quantizer will result in Y=Integer[2141/10]= 214. Unquantizing gives X=214*10=2140 (resulting in the expected loss of precision from the quantization process). Alternatively, where quantization of coefficients has been accomplished in accordance with their relative significance, unquantization may be similarly be accomplished through a comparable expansion or restoration of the number of bits in accordance with the relative significance of the coefficients.

Optionally, a second level of unquantization may be employed during or after the inverse-transform process to compensate for any precision control quantization employed during the transform process.

4. Color Image Compression

An alternative embodiment of the present invention will now be described in connection with color imagery. Color imagery may be represented as a series of data points, each having three components—typically, the additive components red, green and blue. The RGB color space, however, contains more information than needed by humans to perceive its psycho-visual contents. Color images are, thus, typically transformed onto another color space, e.g., the $YC_rC_b$ color space (as used in JPEG), using a known transformation equation: in this example, the color component Y represents the "luminance" (or grey scale) portion of the color space, and the color components $C_r$ and $C_b$ represent "chrominance" (or color information). The choice of $YC_rC_b$ is not purely an arbitrary decision, as the representation of color images using this transformation appears through experimentation to be more tolerant to quantization than other known color transformation models, such as YIQ, L*U*V*, UVW, etc. The benefits of the present invention as to image compression, however, are not limited to a particular color transformation (such as $Yc_rC_b$); those skilled in the art will recognize that the techniques of the present invention are applicable to other color transformations as well.

It is well known that human vision is not equally perceptive to luminance and chrominance information. For example, it is known that human vision is less sensitive to higher frequency chrominance information than for luminance information. Thus, when color imagery is represented as a combination of luminance and chrominance information, the chrominance information may be effectively subsampled (reducing the high frequency content) without perceived loss of quality in the reconstructed color imagery. Typically, the chrominance portions may be subsampled by a factor of 4:1 compared to the corresponding luminance data portion. Subsampling may be accomplished using any one of a number of well-known techniques. For example, subsampling may be accomplished by choosing one pixel from a small region of pixels and throwing away the rest, or by assigning a single pixel in a region with a value equal to the average value of the pixels in the region; subsampling may also be accomplished by applying a low-pass filter to a region and extracting one pixel from the filtered result.

Figure 6:
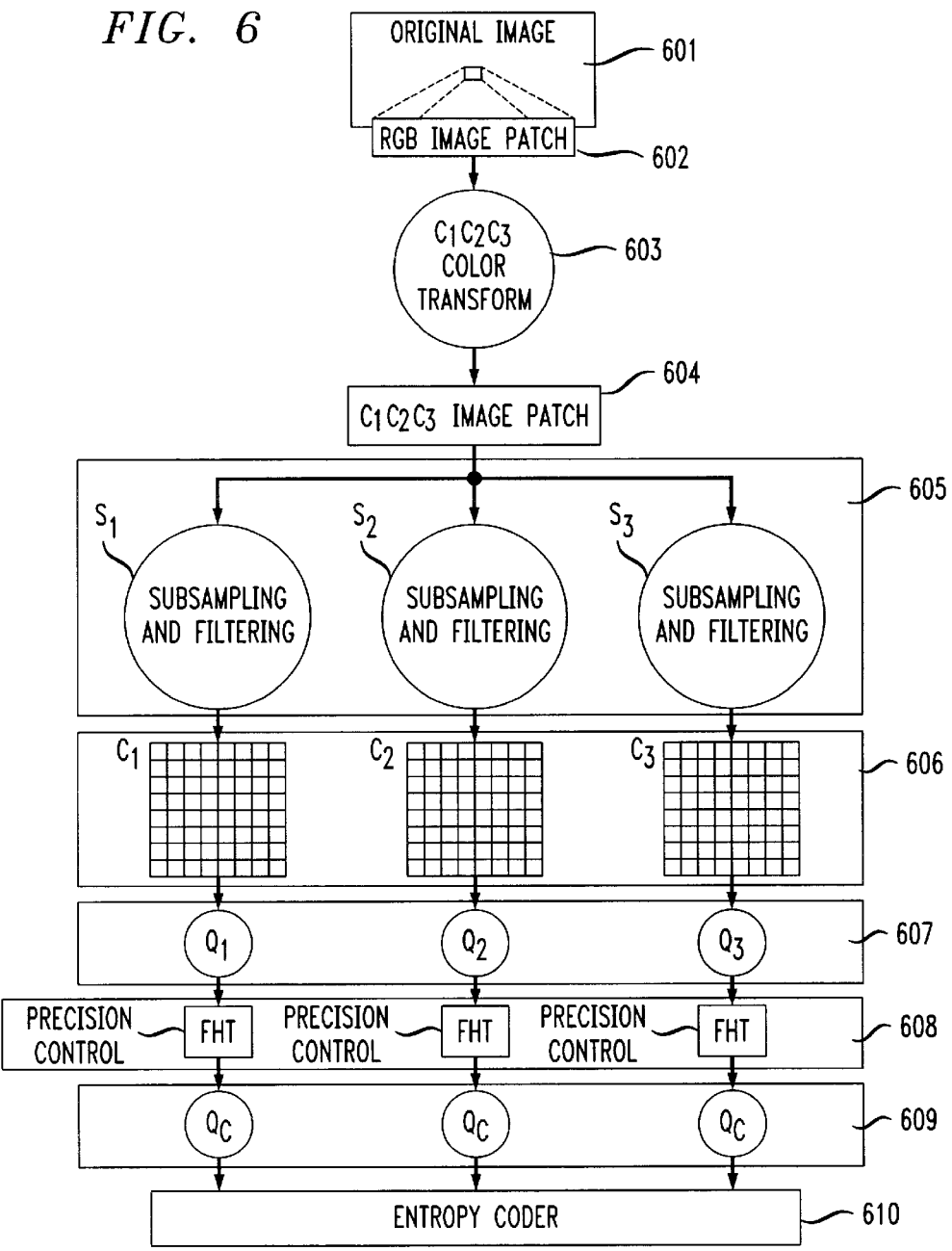
FIG. 6 contains a block diagram showing image data compression in accordance with an alternative embodiment of the present invention.

With reference to FIG. 6, an alternative embodiment of the present invention the image compression scheme of the present invention will now be described for color imagery, (i.e., each data point of the input image consists of a three-component value representing the color visual information). Again, for purposes of illustration, it will be assumed that an 8-point FHT (i.e., N=8) is used, and it will be recognized by those skilled in the art that the compression scheme of this embodiment is also applicable to FHT sizes other than where N=8.

From the original color image 601 (which may be an RGB color image or an image representing a different tripartite color scheme), an 8×8 patch 602 is selected and then transformed, using a known transformation equation at 603, onto another color space (e.g., L'PEG), resulting in transformed image patch 604. Those skilled in the art will recognize that the color transformation could, equivalently, be performed before any image sets are extracted from the image.

Each element of image patch 604 consists of a three-component value, denoted $C_1$, $C_2$ and $C_3$, and, thus, image patch 604 may equivalently be considered as a set of three component images, each element of the component image corresponding to one of the transformed color components $C_i$. As shown at 605, color sets may be subsampled where, as discussed above, the subsampling rates for different color components may vary depending upon the relative physical perception of the components; the result is a triplet of transformed and subsampled component images 606.

At 607, an optional vector quantization is applied to the transformed image triplet 606 before the FHT is applied. This quantization is controlled by different parameters, namely $Q_1$, $Q_2$ and Q3. The quantization of these components is given by [$Q_p(x)$], where [x] is the nearest integer to x. Because the spatial resolution associated with the components differs from one to another, various subsampling (or decimation) and filtering stages can be combined with quantization to keep only as much information as is needed for the eye, or for whatever special purpose one might have.

The remainder of the color image compression scheme proceeds as in the case of monochrome imagery, as discussed above in connection with FIG. 4, where each quantized/subsampled component image patch is processed in a like manner as with the monochrome image patch of FIG. 4. Thus, each image component is processed by the 8-pt two-dimensional FHT at 608 (i.e., the 2-D FHT is computed by using two passes of a 1-D FHT, along with optional precision control); the output of the FHT process for each component further quantized by the output quantization process at 609 and combined in with the other image components by an entropy encoder at 610.

Similar to the monochrome scheme described above, restoration of the color image (i.e., expansion of the stored data back into the color image data) is a process of decompression exactly the inverse of the compression process. The coded bitstream is decoded into component coefficients, the coefficients are unquantized for each component, then each component is Hartley inverse-transformed, unquantized again, and supersampled (expanded). Following the expansion, the color components are color inverse-transformed (if a color transform was used) and reassembled into the final image; equivalently, the color inverse-transform process may take place after the reassembly of image sets rather than before reassembly of the image sets.

C. Experimental Results

Using a method implemented in accordance with the preceding discussion, experimental results in image compression have been achieved. The method takes an input RGB image and transforms it into $YC_rC_b$ color space prior to applying the FHT on each patch. For the experiments, the three pre-FHT quantization elements $Q_1$, $Q_2$ and $Q_3$ were set to 1.0, that is, no quantization, and the subsampling rates for different color components were set to 1:1 for Y, 1:4 for $O_r$ and $C_b$ (as in JPEG).

Figure 7:
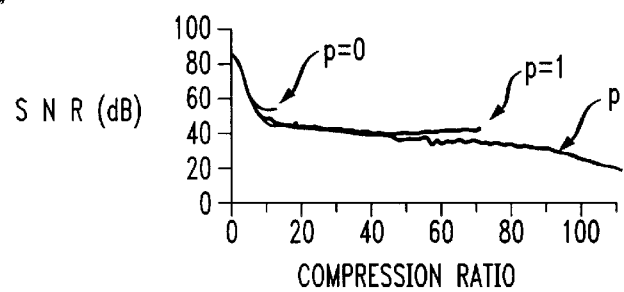
FIG. 7 shows SNR measurements for various precision control settings and compression ratios.

The coefficients output by the FHT transform were quantized and coded with a variation of the variable-length integer coding described above in connection with FIG. 5. Three precision control settings were chosen, corresponding to three different hardware implementations. After running the images through the compression algorithm, each of the decompressed images was then compared to its original using the SNR, given, as usual, by $$PSNR(Y, \hat{Y}) = 20\log_{10}\frac{\sum_{i=0}^{m-1} y_i^2}{\sum_{i=0}^{m-1}(y_i - \hat{y}_i)^2}\text{dB}$$

where Y is the original signal and $\hat{Y}$ is the reconstructed signal. A plot of the SNR against compression ratio for three precision control settings is shown in FIG. 7. Evaluation of the SNR for the test images shows that some pictures in the test set (for example, Piet Mondrian's paintings, other simple geometrical abstract art and bucolic landscapes) could be compressed to very high ratios while keeping a reasonably high signal to noise ratio. These very few outliers resulted in an unexpected raise in the curves, giving the false impression that the algorithm gave better results with compression ratios between 20:1 to 40:1 than with compression ratio around 10:1, with p=0. These outliers have been removed from FIG. 7 because they were misleading.

Comparison of the Fast Hartley Transform with the DCT shows that the FHT exhibits different properties than the DCT. Compared to the DCT, the FHT has many more high frequency components in its kernel. The Hartley Transform, therefore, extracts more information about the high frequency contents of the image. With heavy quantization (for example, c=150 and p=0), it has been observed in experiments that blocks may start to appear to be misaligned, but that high frequency components (i.e., finer detail in the image data) are still clear.

There is not yet a deblocking algorithm (such as the one in used in conjunction with JPEG). However, in experimentation it has been observed that ringing in high detail areas of the image is less severe with the FHT; compared to the FHT-based compression scheme of the present invention, there is much more ringing in the high detail regions of the image exhibited at the same compression ratios using the DCT or the JPEG compression schemes.

D. Implementation

The image compression scheme of the present invention may be implemented on any number of a variety of digital processing platforms, such as: a digital signal processor, e.g., a high speed digital signal processor; a programmable computer, e.g., a personal computer (PC) or a high-end workstation such as those made by Silicon Graphics or Sun Microsystems; or even a programmable logic device, e.g., a field programmable gate array. Such a digital signal processor, computer or programmable logic device in which the image compression scheme may be implemented could be part of a service platform, such as a storage and retrieval platform for archiving images (e.g., photographs, medical images), documents or seismic data, a video game player (e.g., a game station made by Sony, Nintendo or Sega) or a video appliance (e.g., video disc player, photo-CD player, etc. The image compression scheme could also be implemented as a plug-in software module for a Web browser, similar to the way in which the JPEG algorithm is implemented in a Web browser.

E. Further Improvements

As a further improvement to the technique of the present invention, a more sophisticated encoding scheme may be employed to handle runs of zeros and other coefficients. To reduce the numbers of bits for the DC terms, they are now differentially encoded (as in JPEG); further improvement may be obtained by using arithmetic coding for all of the coefficients. Another good improvement may be obtained by using a deblocking algorithm. Such an algorithm would compensate for block misalignment at high compression ratios so that the blocking effect disappears or becomes less noticeable.

The computation speed and compression ratios attainable using the advantages of the present invention may be applied in applications such as image, sound, and video compression and video telephony. Video telephony, for instance, is commonly bounded by ISDN lines, which are either 64 k bits/s or 128 k bits/s. At a 128 kbs, up to 120 kbs can be used for the picture (with the remaining 8 kbs used for audio; there are many good audio codecs that uses a bandwidth of around 8 kbs to transmit voice at more than telephone quality). A 120 kbs link would permit transmission of about 2 full frames (320×200×24 bits) per second at a compression ratio of 30:1—and with the expectation of a visually comfortable 30 dB SNR. Higher rates, up to 15 frames/sec, can be achieved by combining the compression technique described above with the use of differential coding and motion compensation, etc.

In summary, an image compression and expansion system based upon the Fast Hartley Transform has been presented which utilized the benefits of the FHT as a transform that can be computed very efficiently in software or implemented with very little logic in hardware.

What has been described is merely illustrative of the application of the principles of the present invention. Other arrangements and methods can be implemented by those skilled in the art without departing from the spirit and scope of the present invention.

What is claimed is:

1. A method for compressing an image, comprising the steps of:
   a. dividing the image into at least one image set, wherein each image set is a two-dimensional array of pixels having a number of columns M and a number of rows N; and
   b. for each image set:
      i. transforming the image set into a set of coefficients using a reversible transform, wherein the reversible transform comprises a two-stage Hartley transform, said two-stage Hartley transform comprising, in any order, one pass of a one-dimensional row Hartley transform and one pass of a one-dimensional column Hartley transform, each pass of the one-dimensional row and the one-dimensional column Hartley transform being computed using a matrix representation requiring at most two distinct multiplication operations when multiplying a vector;
      ii. quantizing each coefficient of the set of coefficients; and
      iii. coding each quantized coefficient of the set of coefficients in accordance with an entropy code.

2. The method according to claim 1, wherein each of the one-dimensional row Hartley transform and the one-dimensional column Hartley transform are computed without using multiplication instructions performed by a processor.

3. The method according to claim 1, wherein each of the one-dimensional row Hartley transform and the one-dimensional column Hartley transform are computed using only addition, subtraction and bit-shifting.

4. The method according to claim 1, wherein the step of transforming the image set further comprises controlling the precision of at least one stage of the Hartley transform by limiting the number of bits used to represent each coefficient of the set of coefficients resulting from the stage of the transform.

5. The method according to claim 1, wherein the step of quantizing each coefficient of the set of coefficients comprises the substeps of:
   (a) determining the relative significance of the coefficient; and
   (b) retaining a number of bits used to represent the coefficient in accordance with its determined relative significance.

6. The method according to claim 5, wherein the step of determining the relative significance of the coefficient comprises sorting the set of coefficients in accordance with a predetermined distribution of frequencies.

7. The method according to claim 5, wherein the step of determining the relative significance of the coefficient comprises sorting the set of coefficients in accordance with a statistically-determined energy distribution.

8. The method according to claim 1, wherein the image comprises components corresponding to color information.

9. The method according to claim 8, further comprising the step of before transforming the image set using a reversible transform, computing a color transform upon the color components of the image set.

10. The method according to claim 8, further comprising the step of before transforming the image set using a reversible transform, subsampling at least one of the color components of the image set.

11. The method according to claim 10, further comprising the step of before transforming the image set using a reversible transform, quantizing each pixel contained in at least one of the color components of the image set.

12. The method according to claim 8, wherein the step of transforming the image set further comprises controlling the precision of the reversible transform by limiting the number of bits used to represent each coefficient of the set of coefficients resulting from the reversible transform.

13. The method according to claim 1, wherein the entropy code is obtained for an expected distribution of coefficients through the steps of:
   a. computing a canonical Huffman coding tree for the expected distribution of coefficients;
   b. combining all codes of equal length into a common code group;
   c. assigning to each code group a code prefix based upon the structure of the canonical Huffman coding tree; and
   d. assigning a suffix to each separate symbol in the code group.

14. The method according to claim 1, further comprising the step of storing the coded quantized coefficients.

15. A method for restoring from compressed image data an image having at least one image set comprised of a two-dimensional array of pixels having a number of columns M and a number of rows N, comprising the steps of:
   a. decoding the compressed image data into at least one set of coefficients in accordance with an entropy code;
   b. for each set of coefficients:
      i. unquantizing the coefficients;
      ii. inverse-transforming the unquantized coefficients into an image set using a reversible transform, wherein the reversible transform comprises a two-stage Hartley transform, said two-stage Hartley transform comprising, in any order, one pass of a one-dimensional row Hartley transform and one pass of a one-dimensional column Hartley transform, each pass of the one-dimensional row and the one-dimensional column Hartley transform being computed using a matrix representation requiring at most two distinct multiplication operations when multiplying a vector; and
   c. combining each image set into the image.

16. The method according to claim 15, wherein each of the one-dimensional row Hartley transform and the one-dimensional column Hartley transform are computed without using multiplication instructions performed by a processor.

17. The method according to claim 15, wherein each of the one-dimensional row Hartley transform and the one-dimensional column Hartley transform are computed using only addition, subtraction and bit-shifting.

18. The method according to claim 15, wherein the step of inverse-transforming the unquantized coefficients further comprises compensating for precision control used in connection with compression of the image data by expanding the number of bits used to represent each pixel resulting from at least one stage of the Hartley transform.

19. The method according to claim 15, wherein he step of unquantizing each of the coefficients comprises the substeps of:
   (a) determining the relative significance of the coefficient; and
   (b) restoring a number of bits used to represent the coefficient in accordance with its determined relative significance.

20. The method according to claim 15, wherein the image comprises color components.

21. The method according to claim 20, further comprising the step of before combining each image set into the image, computing a color inverse-transform upon the color components of each image set.

22. The method according to claim 20, further comprising the step of before combining each image set into the image, re-expanding at least one of the color components of each image set.

23. The method according to claim 20, further comprising the step of computing a color inverse-transform upon the color components of the image.

24. The method according to claim 15, wherein the step of decoding the compressed image data into at Least one set of coefficients in accordance with an entropy code includes the substeps of:
   i. determining a code group corresponding to a code prefix by matching a prefix portion of the compressed image data against a set of known code prefixes associated with the entropy code; and
   ii. identifying the value of the coefficient within the determined code group by matching a suffix portion of the set of compressed image data against a set of known code suffixes associated with the entropy code.

25. A system for compressing an image divisible into at least one image set, wherein each image set is a two-dimensional array of pixels having a number of columns M and a number of rows N, comprising:
   a. a transformer that transforms each image set into a set of coefficients using a reversible transform, wherein the reversible transform comprises a two-stage Hartley transform, said two-stage Hartley transform comprising, in any order, one pass of a one-dimensional row Hartley transform and one pass of a one-dimensional column Hartey transform, each pass of the one-dimensional row and the one-dimensional column Hartley transform being computed using a matrix representation requiring at most two distinct multiplication operations when multiplying a vector;
   b. a quantizer that quantizes each coefficient of the set of coefficients; and
   c. a coder that encodes the set of quantized coefficients in accordance with an entropy code.

26. The system according to claim 25, wherein each of the one-dimensional row Hartley transform and the one-dimensional column Hartley transform are computed without using multiplication instructions performed by a processor.

27. The system according to claim 25, wherein each of the one-dimensional row Hartley transform and the one-dimensional column Hartley transform are computed using only addition, subtraction and bit-shifting.

28. The system according to claim 25, wherein the transformer includes a precision controller that limits the number of bits used to represent each coefficient of the set of coefficients resulting from the transformer.

29. The system according to claim 25, wherein the quantizer determines the relative significance of each coefficient and retains a number of bits used to represent the coefficient in accordance with its determined relative significance.

30. The system according to claim 29, wherein the quantizer determines the relative significance of each coefficient by sorting the set of coefficients in accordance with a predetermined distribution of frequencies.

31. The system according to claim 29, wherein the quantizer determines the relative significance of each coefficient by sorting the set of coefficients in accordance with a statistically-determined energy distribution.

32. The system according to claim 25, further comprising memory to store at least one image set.

33. A system for restoring from compressed image data an image having at least one image set comprised of a two-dimensional array of pixels having a number of columns M and a number of rows N, comprising:
   a. a decoder that decodes the compressed image data into at least one set of coefficients in accordance with an entropy code;
   b. a unquantizer that unquantizes each coefficient of each set of coefficients; and
   c. an inverse-transformer that inverse-transforms each set of unquantized coefficients into an image set using a reversible transform, wherein the reversible transform comprises a two-stage Hartley transform, said two-stage Hartley transform comprising, in any order, one pass of a one-dimensional row Hartley transform and one pass of a one-dimensional column Hartley transform, each pass of the one-dimensional row and the one-dimensional column Hartley transform being computed using a matrix representation requiring at most two distinct multiplication operations when multiplying a vector.

34. The system according to claim 33, wherein each of the one-dimensional row Hartley transform and the one-dimensional column Hartley transform are computed without using multiplication instructions performed by a processor.

35. The system according to claim 33, wherein each of the one-dimensional row Hartley transform and the one-dimensional column Hartley transform are computed using only addition, subtraction and bit-shifting.

36. The system according to claim 33, wherein the inverse-transformer includes precision compensation that compensates for precision control used in connection with compression of image data by expanding the number of bits used to represent each pixel resulting from the Hartley transform.

37. The system according to claim 33, wherein the unquantizer determines the relative significance of each coefficient and restores a number of bits used to represent the coefficient in accordance with its determined relative significance.

38. The system according to claim 33, further comprising memory to store at least one image set.

39. An article of manufacture comprising a computer-readable medium having stored thereon instructions for compressing an image, said instructions which, when executed by a processor, cause the processor to:
   d. divide the image into at least one image set, wherein each image set is a two-dimensional array of pixels having a number of columns M and a number of rows N; and
   e. for each image set:
      i. transform the image set into a set of coefficients using a reversible transform, wherein the reversible transform comprises a two-stage Hartley transform, said two-stage Hartley transform comprising, in any order, one pass of a one-dimensional row Hartley transform and one pass of a one-dimensional column Hartley transform, each pass of the one-dimensional row and the one-dimensional column Hartley transform being computed using a matrix representation requiring at most two distinct multiplication operations when multiplying a vector:
      ii. quantize each coefficient of the set of coefficients; and
      iii. code each quantized coefficient of the set of coefficients in accordance with an entropy code.

40. The article of manufacture according to claim 39, wherein each of the one-dimensional row Hartley transform and the one-dimensional column Hartley transform are computed without using multiplication.

41. The article of manufacture according to claim 39, wherein each of the one-dimensional row Hartley transform and the one-dimensional colunm Hartley transform are computed using only addition, subtraction and bit-shifting.

42. The article of manufacture according to claim 39, wherein the instructions, when executed by a processor, further cause the processor to control the precision of at least one stage of the Hartley transform by limiting the number of bits used to represent each coefficient of the set of coefficients resulting from the stage of the transform.

43. The article of manufacture according to claim 39, wherein the instructions, when executed by a processor, cause the processor to quantize each coefficient of the set of coefficients by:
   (a) determining the relative significance of the coefficient; and
   (b) retaining a number of bits used to represent the coefficient in accordance with its determined relative significance.

44. The article of manufacture according to claim 43, wherein the instructions, when executed by a processor, cause the processor to determine the relative significance of the coefficient by sorting the set of coefficients in accordance with a predetermined distribution of frequencies.

45. The article of manufacture according to claim 43, wherein the instructions, when executed by a processor, cause the processor to determine the relative significance of the coefficient by sorting the set of coefficients in accordance with a statistically-determined energy distribution.

46. The article of manufacture according to claim 39, wherein the image comprises components corresponding to color information.

47. The article of manufacture according to claim 46, wherein the instructions, when executed by a processor, further cause the processor to compute a color transform upon the color components of the image set before transforming the image set using a reversible transform.

48. The article of manufacture according to claim 46, wherein the instructions, when executed by a processor, further cause the processor to subsample at least one of the color components of the image set before transforming the image set using a reversible transform.

49. The article of manufacture according to claim 48, wherein the instructions, when executed by a processor, further cause the processor to quantize each pixel contained in at least one of the color components of the image set before transforming the image set using a reversible transform.

50. The article of manufacture according to claim 46, wherein the instructions, when executed by a processor, further cause the processor to control the precision of the reversible transform by limiting the number of bits used to represent each coefficient of the set of coefficients resulting from the reversible transform.

51. The article of manufacture according to claim 39, wherein the entropy code is obtained for an expected distribution of coefficients by:

(a) computing a canonical Huffman coding tree for the expected distribution of coefficients;

(b) combining all codes of equal length into a common code group;

(c) assigning to each code group a code prefix based upon the structure of the canonical Huffman coding tree; and (d) assigning a suffix to each separate symbol in the code group.

52. The article of manufacture according to claim 39, wherein the instructions, when executed by a processor, further cause the processor to store the coded quantized coefficients in a memory.

53. An article of manufacture comprising a computer-readable medium having stored thereon instructions for restoring from compressed image data an image having at least one image set comprised of a two-dimensional array of pixels having a number of columns M and a number of rows N, said instructions which, when executed by a processor, cause the processor to:

a. decode the compressed image data into at least one set of coefficients in accordance with an entropy code;

b. for each set of coefficients:
  i. unquantize the coefficients;
  ii. inverse-transform the unquantized coefficients into an image set using a reversible transform, wherein the reversible transform comprises a two-stage Hartley transform, said two-stage Hartley transform comprising, in any order, one pass of a one-dimensional row Hartley transform and one pass of a one-dimensional column Hartley transform, each pass of the one-dimensional row and the one-dimensional column Hartley transform being computed using a matrix representation requiring at most two distinct multiplication operations when multiplying a vector; and c. combine each image set into the image.

54. The article of manufacture according to claim 53, wherein each of the one-dimensional row Hartley transform and the one-dimensional column Hartley transform are computed without using multiplication instructions performed by a processor.

55. The article of manufacture according to claim 53, wherein each of the one-dimensional row Hartley transform and the one-dimensional column Hartley transform are computed using only addition, subtraction and bit-shifting.

56. The article of manufacture according to claim 53, wherein the instructions, when executed by a processor, further cause the processor to compensate for precision control used in connection with compression of image data by expanding the number of bits used to represent each pixel resulting from at least one stage of the Hartley transform.

57. The article of manufacture according to claim 53, wherein the instructions, when executed by a processor, cause the processor to unquantize each of the coefficients by:

(a) determining the relative significance of the coefficient; and (b) restoring a number of bits used to represent the coefficient in accordance with its determined relative significance.

58. The article of manufacture according to claim 53, wherein the image comprises color components.

59. The article of manufacture according to claim 58, wherein the instructions, when executed by a processor, further cause the processor to compute a color inverse-transform upon the color components of each image set before combining each image set into the image.

60. The article of manufacture according to claim 58, wherein the instructions, when executed by a processor, further cause the processor to re-expand at least one of the color components of each image set before combining each image set.

61. The article of manufacture according to claim 58, wherein the instructions, when executed by a processor, further cause the processor to compute a color inverse-transform upon the color components of the image.

62. The article of manufacture according to claim 57, wherein the instructions, when executed by a processor, cause the processor to decode the compressed image data into at least one set of coefficients in accordance with an entropy code by:

i. determining a code group corresponding to a code prefix by matching a prefix portion of the compressed image data against a set of known code prefixes associated with the entropy code; and ii. identifying the value of the coefficient within the determined code group by matching a suffix portion of the set of compressed image data against a set of known code suffixes associated with the entropy code.

63. A method for compressing an image, comprising the steps of:

a. dividing the image into at least one image set, wherein each image set is a two-dimensional array of pixels having a number of columns M and a number of rows N; and b. for each image set:
  iii. transforming the image set into a set of coefficients using a two-stage Hartley transform, said two-stage Hartley transform comprising, in any order, one pass of a one-dimensional row Hartley transform and one pass of a one-dimensional column Hartley transform, each pass computed by multiplying a matrix representation of the one-dimensional row Hartley transform by the image set, the matrix representation having 8 rows and 8 columns, having three distinct values apart from negative signs, and having the property that a product of the matrix representation with any vector having 8 elements requires at most two distinct multiplication operations;
  iv. quantizing each coefficient of the set of coefficients; and
  v. coding each quantized coefficient of the set of coefficients in accordance with an entropy code.

* * * * *